(12) United States Patent
Dalal et al.

(10) Patent No.: US 6,344,234 B1
(45) Date of Patent: Feb. 5, 2002

(54) METHOD FOR FORMING REFLOWED SOLDER BALL WITH LOW MELTING POINT METAL CAP

(75) Inventors: Hormazdyar Minocher Dalal, Milton, NY (US); Alexis Bitaillou, Bretigny sur Orge (FR); Kenneth Michael Fallon, Vestal, NY (US); Gene Joseph Gaudenzi, Purdys, NY (US); Kenneth Robert Herman, Poughkeepsie, NY (US); Frederic Pierre, Mennecy; Georges Robert, Baulne, both of (FR)

(73) Assignee: International Business Machines Corportion, Armonk, NY (US)

( * ) Notice: Subject to any disclaimer, the term of this patent is extended or adjusted under 35 U.S.C. 154(b) by 0 days.

(21) Appl. No.: 08/476,475

(22) Filed: Jun. 7, 1995

(51) Int. Cl.[7] .................................................. B05D 5/12
(52) U.S. Cl. ............................. 427/96; 427/98; 427/99; 427/282; 29/840; 228/180.22; 205/125
(58) Field of Search ................................ 427/58, 96, 98, 427/99, 123, 124, 256, 259, 261, 282; 174/260, 261; 361/760, 773, 779; 257/737, 738, 750, 777, 778, 779, 781; 228/180.22, 194, 254; 29/840; 205/123, 125, 660, 221

(56) References Cited

U.S. PATENT DOCUMENTS

| | | | | | |
|---|---|---|---|---|---|
| 3,458,925 | A | * | 8/1969 | Napier et al. | 228/180.22 |
| 3,512,051 | A | * | 5/1970 | Noll | 317/234 |
| 4,536,421 | A | * | 8/1985 | Matsuzawa et al. | 427/98 |
| 4,673,772 | A | * | 6/1987 | Satoh et al. | 228/180.22 |
| 4,739,917 | A | * | 4/1988 | Baker | 228/180.22 |
| 4,830,723 | A | * | 5/1989 | Galvangi et al. | 427/282 |
| 4,950,623 | A | * | 8/1990 | Dishon | 228/180.22 |
| 4,967,950 | A | | 11/1990 | Legg et al. | 228/180.2 |
| 5,075,965 | A | | 12/1991 | Carey et al. | 29/840 |
| 5,130,779 | A | | 7/1992 | Agarwala et al. | 357/67 |
| 5,154,341 | A | * | 10/1992 | Melton et al. | 228/180.2 |
| 5,251,806 | A | | 10/1993 | Agarwala et al. | 228/180.22 |

FOREIGN PATENT DOCUMENTS

| JP | 62-117346 | * | 5/1987 | |
|---|---|---|---|---|
| JP | 62117346 | | 5/1987 | H01L/21/92 |

OTHER PUBLICATIONS

Dawson, et al., "Indium–Lead–Indium Chip Joining", IBM Technical Disclosure Bulletin, vol. 11, No. 11, p. 1528, Apr. 1969.

*Microelectronics Packaging Handbook*, edited by Rao R. Tummala & Eugene J. Rymaszewski, SR28–4413–00, pp. 366–391. No Date Given.

* cited by examiner

Primary Examiner—Brian K. Talbot
(74) Attorney, Agent, or Firm—Ira D. Blecker

(57) ABSTRACT

A method and structure for a solder interconnection, using solder balls for making a low temperature chip attachment directly to any of the higher levels of packaging substrate is disclosed. After a solder ball has been formed using standard methods it is reflowed to give the solder ball a smooth surface. A layer of low melting point metal, such as, bismuth, indium or tin, preferably, pure tin, is deposited on the top of the solder balls. This structure results in localizing of the eutectic alloy, formed upon subsequent low temperature joining cycle, to the top of the high melting solder ball even after multiple low temperature reflow cycles. This method does not need tinning of the substrate to which the chip is to be joined, which makes this method economical. It has also been noticed that whenever temperature is raised slightly above the eutectic temperature, the structure always forms a liquid fillet around the joint with copper wires. This liquid fillet formation results in substantial thermal fatigue life improvement for reduced stress at interface; and secondly, provides an easy means to remove chip for the purpose of chip burn-in, replacement or field repairs.

26 Claims, 2 Drawing Sheets

METHOD FOR FORMING REFLOWED SOLDER BALL WITH LOW MELTING POINT METAL CAP

CROSS-REFERENCE TO RELATED PATENT APPLICATION

This Patent Application is related to U.S. patent application Ser. No. 08/476474, entitled, "REFLOWED SOLDER BALL WITH LOW MELTING POINT METAL CAP", filed on Jun. 7, 1995, now abandoned. Presently assigned to the assignee of the instant application and the disclosure of which is incorporated herein by reference.

FIELD OF THE INVENTION

The present invention relates generally to a new structure and method for capping of solder balls with a cap of at least one low melting point metal. More particularly, the invention encompasses a structure where the already reflowed solder balls are capped with at least one layer of tin. A method for such tin capping is also disclosed.

BACKGROUND OF THE INVENTION

Semiconductor devices are becoming smaller and more dense with the evolution of new technology. However, increases in circuit density produce a corresponding challenge to improve chip and chip connections in order to remain competitive. Chip manufacturers are therefore constantly challenged to improve the quality of their products by identifying and improving their products. Whereas significant process improvements are being made by reducing process variability. Process improvements alone are not sufficient to increase both yield and reliability of these products.

Electronic products typically comprise of plurality of components. The packaging of these components follow a hierarchy where an Integrated Circuit (IC) chip comprising of semiconductor micro-devices are connected (1st level assembly) to carriers made of ceramic or organic laminates comprising one or several layers of metal interconnection lines. These carriers may also contain some other discrete devices like capacitors, resistors etc. Thus assembled carriers with IC chips, along with some kind of sealing and cooling methodology, are called modules. These modules, in turn, are connected to cards (2nd level assembly) usually made of organic laminates with printed circuits on either side of the card. These cards are then connected to boards (3rd level assembly). The number of assembly levels depends mostly on complexity of functions required.

There are three primary 1st level, or chip-level, interconnection technologies, viz., Wire Bonding (WB), Tape Automated Bonding (TAB) and Solder Bonding (SB), such as, for example, C4 (Controlled Collapse Chip Connection).

A number of products presently in the market typically eliminate the first level package by bonding the chips directly onto the card or board. This provides smaller, simpler and lower cost package. For low cost products, the most common method of connecting chips directly on card has been the Wire Bonding (WB) technique. The Tape Automated Bonding (TAB) has now come to wider use for directly attaching chip on card (or board) because TAB by itself is considered to be the 1st level assembly; secondly, because of its mechanical flexibility, it is suitable for chip mounting on flexible circuit carriers.

However, with the emergence of Very Large Scale and Ultra Large Scale Integrated Circuit chips, the number of Input/Output (I/O) terminals on a chip have grown so large that not only a close spacing of I/O pads is required but also an array pattern of I/O pads is required.

The requirement of array pattern renders wire bonding and TAB methods inapplicable.

Another limiting factor for use of these methods is difficulty in testing and/or burning-in of these mounted chips; this limits the card yield thus making the product expensive.

Yet another shortcoming is that rework is economically unfeasible.

These limitations necessitates use of a C4 like technology for joining chips directly on card.

The C4 or Controlled Collapse Chip Connection technology has been successfully employed for 1st level assembly of chip on ceramic carriers. The C4 technology is described in detail by many authors, see for example, Microelectronics Packaging Handbook, edited by, Rao R. Tummala and Eugene J. Rymaszewski, pages 366–391 (1989), the disclosure of which is incorporated herein by reference.

The C4 interconnection is comprised of two main elements, a solder reflowable pad called Ball Limiting Metallurgy (BLM), and a ball of solder. The BLM is comprised of an adhesive layer like Cr or TiW, and a solder reflowable layer like copper or nickel. The BLM materials and their thicknesses are judiciously chosen to provide good and reliable electrical, mechanical and thermal stability to interconnect structure. The solder material used for C4 is preferably a low percentage (about 2 percent to about 10 percent) tin alloyed with lead. This combination was initially used to prevent melting of the reflowed solder ball or C4 during the next level of interconnection but now it is mostly used:

(i) to reduce reaction between copper of BLM and tin, as high stresses resulting from excessive copper-tin intermetallic imparts a high stress concentration on underlaying passivation, and, (ii) for better thermal fatigue characteristic offered by lower Sn percentage.

Presently, there are two problems that limit the use of current C4 technology for 2nd or higher level assembly, i.e., for Direct Chip Attach (DCA) on card. First, it limits the 2nd level interconnection to Pin-Through-Hole (PTH) technology and precludes the use of cost effective, space saving Surface Mount technology (SMT), because a joining temperature higher than melting point of the SMT solder is required. Second, the relatively high joining temperature (340° C.–380° C.) will char the card organics.

There are two ways to lower the joining temperature for DCA. One approach is to provide an eutectic (or lower melting) solder on a card metallization. A method pertaining to this approach is described in U.S. Pat. No. 4,967,950 to Legg and Schrottke, which is presently assigned to the assignee of the instant patent application. Legg and Schrottke describes a general scheme for attaching circuit chips to flexible substrate (laminate) using C-4s. The substrate is "tinned" with an alloy of eutectic composition in its contact region with the solder balls on the base of the chip.

The method of pre-coating the card, or an organic carrier, by eutectic solder is taught by Fallon et al., U.S. patent application Ser. No. 08/387,686, entitled "Process for Selective Application of Solder to Circuit Packages", filed on Feb. 13, 1995. In this method, eutectic solder is electroplated on copper conductors of printed circuit card precisely where the Chip C4 bumps would make contact.

A second approach for lowering the joining temperature for Direct Chip Attach (DCA), is to provide a low melting solder on chip C4 rather than on the carrier conductor. Carey et al., in U.S. Pat. No. 5,075,965 and Agarwala et al., in U.S. Pat. Nos. 5,251,806 and 5,130,779, which are presently assigned to the assignee of the instant patent application, and, Japanese Patent Publication No. 62-117346 to Eiji et al., describe various schemes to provide low melting solder on chips.

Carey et al., in U.S. Pat. No. 5,075,965, disclose a method, where an inhomogeneous, anisotropic column consists of lead rich bottom and tin rich top of sufficient thickness to form eutectic alloy. The resulting as-deposited and un-reflowed column is then joined onto the card's conductor.

To circumvent the thermodynamically driven tendency for interdiffusion, Agarwala et al., in U.S. Pat. Nos. 5,251, 806 and 5,130,779, showed a structure where the low melt component is separated from the high melt component by interposing a barrier metal layer. This structure does show a hierarchy of solder material, however, in this structure the column of high melting solder never get reflowed. Because, the stacked solder does not get reflowed there is no metallurgical reaction between the solder stack and the adhesive pad of Ball Limiting Metallurgy (BLM) which is known to cause poor mechanical integrity of the C4 joint.

Eiji et al., in Japanese Patent Publication No. 62-117346, describe an anisotropic column structure of low and high melting solders. The basic objective of this invention is essentially to provide an increase height of a solder joint rather than to provide a low melting solder joining process. In Eiji et al., a high-melting point metallic layer is secured to a chip and a substrate and a low-melting point metallic layer is then formed. The two low-melting point metallic layers are then joined and thereby the chip is joined to the substrate.

IBM Technical Disclosure Bulletin, entitled "Indium-Lead-Indium Chip Joining", W. A. Dawson et al., Vol. 11, No. 11, page 1528 (April 1969), discloses the standard capping of lead with either indium or tin for diffusion bonding. In order to alleviated the problem of chip collapse onto the surface of the substrate an intermediate temperature is employed.

For the purposes of this invention a bump completely composed of low melting eutectic composition is a feature to be avoided as the high tin content reacts with all of the copper of the adhesive layer (Ball Limiting Metallurgy, BLM) giving a thick intermetallic layer. High stresses of reacted BLM have been known to cause solder pads to fall off and to create insulation cracking. The eutectic solder bumps also have poor electromigration and thermal fatigue lifetime. It is also known that low melting eutectic solder suffers from void formation due to thermal migration which causes circuit failure.

Yet another drawback of inhomogeneous, anisotropic solder column is that this structure is unfavorable for electrical tests of circuitry before joining the chips on carriers as the electrical probes gouge into the low melt cap during testing and destroy the cap. Furthermore, for the chip burn-in it is also not feasible to use any of the known multi-layered solder balls, as the temperature that is generally used is between 120–150° C. for burn-in which will cause inter diffusion of the low and the high melt components even before the joining operation begins.

This invention, however, relates generally to interconnection in electronic circuit packages, and more particularly to a new solder interconnection, and a method for making the same, for joining an IC chip directly on higher level packages.

According to the present invention a method is provided for attaching IC chips by interaction between an elemental metal and an alloy to spontaneously form an lower melting alloy after the Controlled Collapse Chip Connection (C4) operation.

The invention also relates to providing a reliable metallurgical system for joining the IC chips on rigid or flexible organic microelectronic circuit cards at low temperatures in order to be compatible with the low temperature processing requirement of the organic cards; and, also to be compatible with Surface Mount or Solder Ball Connect Technologies generally used for higher level interconnections.

PURPOSES AND SUMMARY OF THE INVENTION

The invention is a novel method and structure for providing solder interconnections to a semiconductor integrated chip, wherein the interconnection is designed to lower the melting point only at the tip of the solder interconnection height.

Therefore, one purpose of this invention is to provide an apparatus and a method that will provide at least one solder ball with a cap of at least one lower melting point metal than the already reflowed solder ball.

Another purpose of this invention is to provide for a semiconductor module that is low cost, easy to build and has a high process yield.

It is a purpose of the present invention to provide a low melting interconnection metallurgy on IC chips.

Still another purpose of this invention is to have a semiconductor module which is capable of undergoing several joining cycles and rework cycles.

Yet another purpose of this invention is to increase the reliability of the joint.

Still yet another purpose of the invention is to have a module that is compatible with wafer level electrical test and burn-in.

Yet another purpose of this invention is to provide a temporary joint for an Integrated Circuit chip to a surrogate substrate for chip level burn-in.

Therefore, in one aspect this invention comprises a method of capping a solder ball with at least one layer of low melting point metal, said method comprises the steps of:

(a) forming said solder ball on a substrate, (b) placing a mask over said solder ball such that a portion of said solder ball is exposed, (c) depositing at least one layer of a low melting point metal over said solder ball through said mask, such that at least a portion of said solder ball has a capping layer of said low melting point metal, and wherein the melting point of said low melting point metal is lower than the melting point of said solder.

In another aspect this invention comprises an interconnect structure comprising a substrate, said substrate having at least one solder ball and at least a portion of said solder ball having at least one coating of a low melting point metal wherein the melting point of said low melting point metal is lower than the melting point of said solder ball.

BRIEF DESCRIPTION OF THE DRAWINGS

The features of the invention believed to be novel and the elements characteristic of the invention are set forth with particularity in the appended claims. The drawings are for illustration purposes only and are not drawn to scale.

Furthermore, like numbers represent like features in the drawings. The invention itself, however, both as to organization and method of operation, may best be understood by reference to the detailed description which follows taken in conjunction with the accompanying drawings in which.

DETAILED DESCRIPTION OF THE INVENTION

It should be noted that the term "solder ball" as used in conjunction with this invention means that the lead and tin have been combined and gone through at least one reflow cycle and formed a "solder ball". Therefore, it should be clear to a person skilled in the art that the invention is an improvement of these already formed solder balls or C4s.

FIGS. 1 through 7, represent an embodiment of the invention where IC chips are processed and made ready for the low melting joining.

Basically, the method of this invention comprising the steps of: depositing a mass of solder, such as, a high melting lead-tin solder on solder wettable I/O terminals on a chip, wafer or substrate; reflowing the deposited solder; after electrical testing and burn-in (if required) re-masking the substrate with metal or organic mask having openings at the sites of the deposited and reflowed solder mass; and depositing a layer of low melting point metal, such as, for example, tin, atop the solder mass.

The invention is based upon an unexpected result which showed that the low melting point metal, such as, tin, that is deposited atop an already reflowed solder mass alloys only with enough solder mass to form a volume of eutectic alloy, atop the solder mass, equivalent to eutectic composition for the deposited mass of tin; relatively little or no further interdiffusion takes place even after multiple times of eutectic melting cycles. Thus, a desired volume of eutectic liquid atop a solid solder mass is formed without any need for a barrier. A volume of eutectic liquid remains present, whenever the joint temperature is raised to eutectic temperature, even after joining on copper interconnections of circuit carrier; this liquid formation at the joint interface presents an ideal condition for easy removal of the joined chip for the purposes of chip replacement without mechanically or thermally affecting other components on the board.

Figure 1:
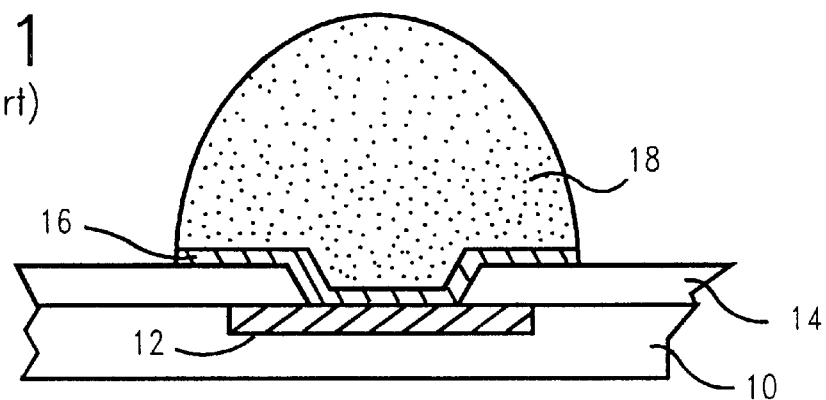
FIG. 1, shows a cross-section of a conventional C4, depicting a reflowed solder ball on solder wettable pads (BLM).

Referring now to FIGS. 1 through 7, where like reference numerals represent the same or similar parts throughout, illustrated in FIG. 1, is a cross-section of a conventional solder ball 18, such as, a C4 18, which is preferably a reflowed high melt (97 percent Pb—3 percent Sn) solder ball on a solder wettable pad (Ball Limiting Metallurgy (BLM)) 16, and making contact through a via to an IC chip internal wiring 12. The internal wiring 12, is in a conventional substrate 10, such as, a chip or a wafer, which has at least one passivation layer 14. The BLM 16, also provides I/O to the substrate 10. The I/O pads could be selected from a group comprising of Cr, TiW, phased Cr and Cu, Cu, Au and alloys thereof. To those skilled in the art, it should be apparent that the IC chip substrate 10, could be a semiconductor wafer, wherein a plurality of devices (not shown) have been formed by conventional methods and interconnected through IC chip internal wires in one or more layers.

The solder ball 18, is preferably a high melting point solder ball, such as, for example, a solder ball comprising of a lead-tin alloy and wherein the alloy contains between about 2 percent to about 10 percent tin or the lead-tin alloy contains between about 98 percent to about 90 percent lead. It is preferred that the solder ball that is formed over the ball limiting metallurgy 16, is a high melting point solder ball with a Pb content of about 97 percent and a Sn content of about 3 percent. The unreflowed solder ball 18, could be formed by a process, such as, for example, solder injection, evaporation or electroplating methods of solder deposition. However, for some application the solder ball 18, could be a low melting point solder. Before the inventive step of this invention is applied to the solder ball 18, it is preferred that all the processing steps of the semiconductor, such as, wafer testing, electrical testing have been completed and the solder has been re-flowed to bring it back to its spherical shape, as more clearly seen in FIG. 1.

Figure 2:
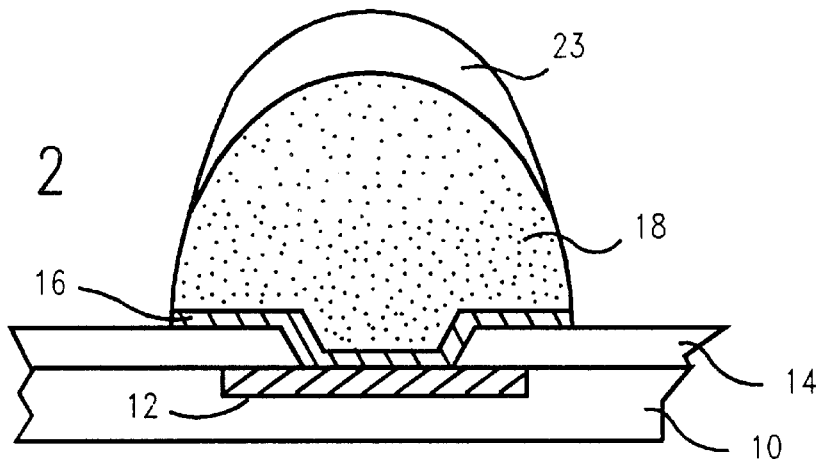
FIG. 2, illustrates a preferred embodiment of this invention where a cap of low melting point metal is deposited on top of the starting C4 structure of FIG. 1.

FIG. 2, illustrates a preferred embodiment of this invention where a cap of low melting point metal 23, such as, for example, tin 23, and preferably, a cap of pure tin 23, has been deposited on top of the starting solder ball 18, structure. It is preferred that the low melting point metal 23, is selected from a group comprising of bismuth, indium, tin or alloys thereof.

Figure 3:
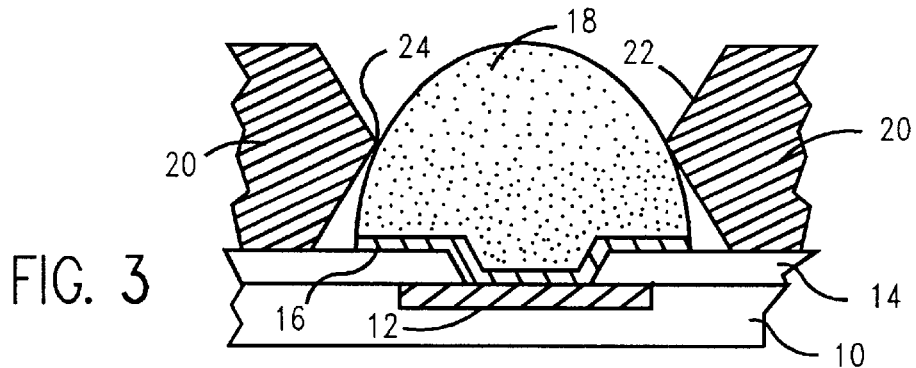
FIG. 3, illustrates one embodiment of the invention showing a cross-section of the C4 solder ball of FIG. 1, after a mask has been aligned.

FIG. 3, illustrates one embodiment of the invention showing a cross-section of the solder ball 18, of FIG. 1, after a mask 20, such as, a metal mask 20, has been aligned. The metal mask 20, that is used is made by creating an opening having sidewalls 22. This is done by etching the mask 20, from both sides, thereby creating a knife edge 24, in the thickness of the mask 20, in the sidewalls 22. This knife edge 24, is preferably in the middle of the thickness of mask 20. However, this knife edge 24, can be along at any location on the sidewalls 22. Care should be taken when placing the mask 20, over the solder balls 18, so that the knife edges 24, do not puncture or gouge or damage the solder balls 18.

Figure 4:
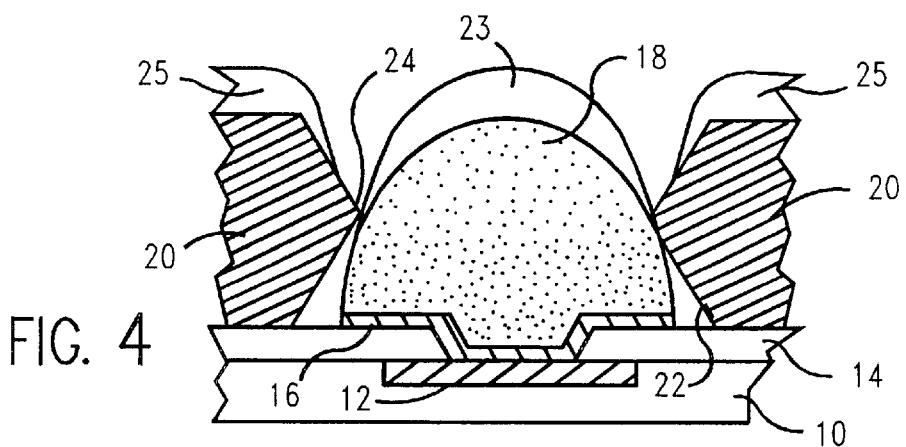
FIG. 4, shows a cross-section of the inventive structure after a layer of low melting point metal has been deposited using the mask of FIG. 3.

FIG. 4, shows a cross-section of the inventive structure after a layer of low melting point metal, such as, tin 23, has been deposited using the metal mask 20, of FIG. 3. Excess tin 25, will get deposited over the mask 20, and it can be subsequently removed by methods well known in the art, or the mask could itself be discarded after the tin capping process of this invention. As can be clearly seen in FIG. 4, that the solder ball 18, has a coating of tin 23, over only a portion of its upper surface. Depending on the crown of tin 23, that is desired on top of the solder ball 18, the mask 20, could be made such that the knife edge 24, is formed at an appropriate location along the thickness of the mask 20.

Figure 5:
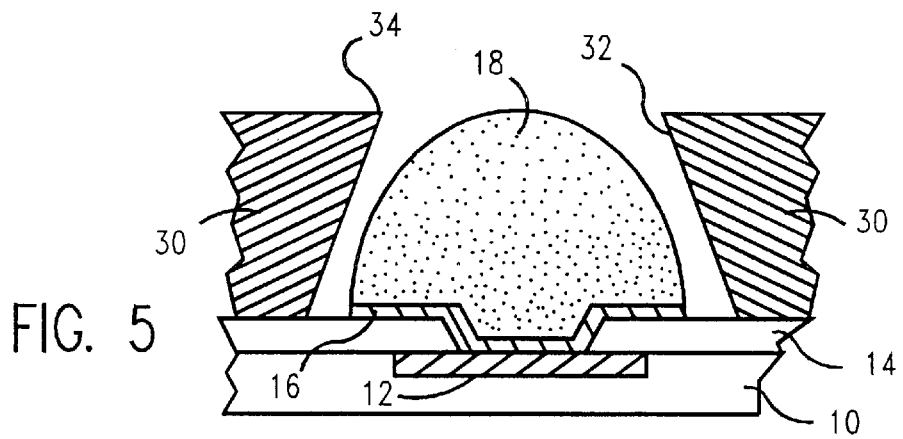
FIG. 5, illustrates another embodiment of the invention showing a cross-section of the C4 solder ball of FIG. 1, after an alternate mask has been aligned.
Figure 6:
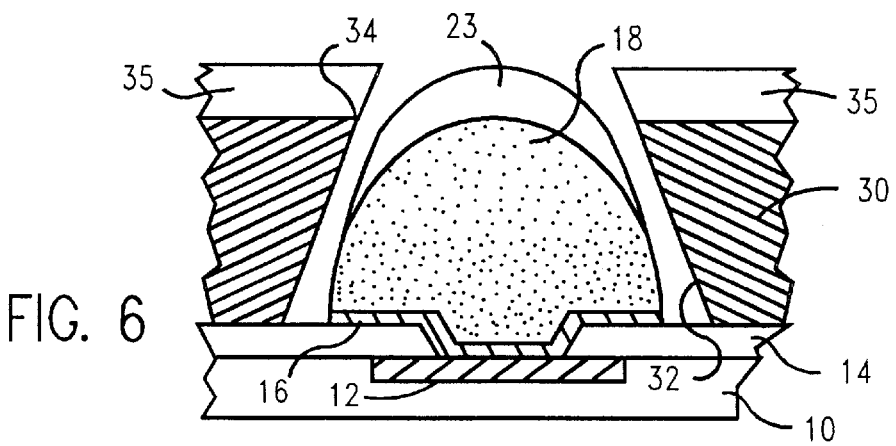
FIG. 6, shows a cross-section of the inventive structure after a layer of low melting point metal has been deposited using the alternate mask of FIG. 5.

FIG. 5, illustrates another embodiment of the invention showing a cross-section of the solder ball 18, of FIG. 1, after an alternate mask 30, such as, a metal mask 30, has been aligned. As stated earlier that in some cases where there is a possibility that the knife edge 24, might damage the solder ball 18, for those situations a alternative mask 30, can be used. The metal mask 30, is made by etching holes from one side only, and thereby raising the knife edge 34, to one end of the mask 30. As shown in FIGS. 5 and 6, sidewalls 32, have a slope that accommodates the hemispherical structure of the reflowed solder ball 18.

FIG. 6, shows a cross-section of the inventive structure after a layer of low melting point metal 23, such as, tin 23, has been deposited using the alternate metal mask 30, of FIG. 5. Excess tin 35, will be deposited over the mask 30, and it can be subsequently removed by methods well known in the art, or the mask could itself be discarded after the tin capping process of this invention. As can be clearly seen in FIG. 6, that the solder ball 18, has a coating of tin 23, over only a portion of its upper surface. Depending on the crown of tin 23, that is desired on top of the solder ball 18, the mask 30, could be made such that the knife edge 34, is formed at an appropriate location along the thickness of the mask 30.

Figure 7:
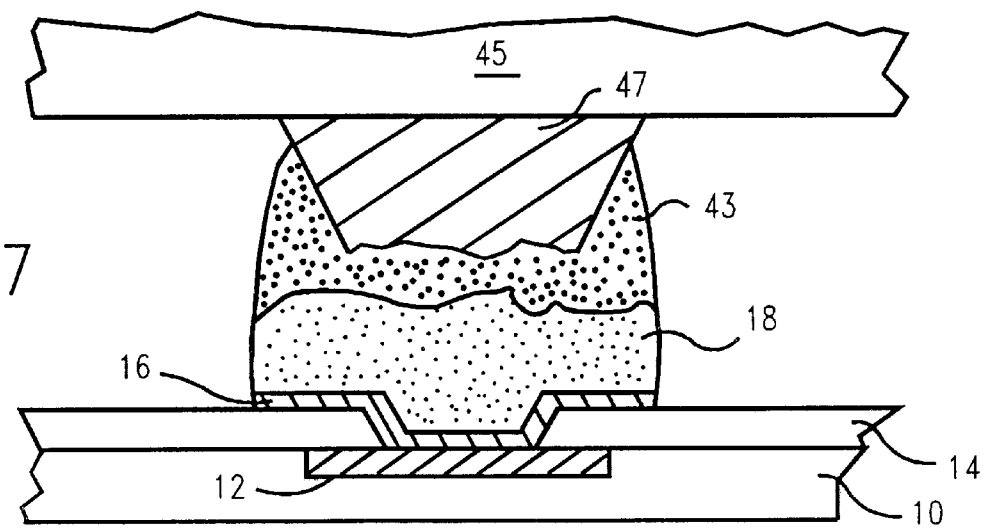
FIG. 7, shows a cross-section of a tin capped solder ball of FIG. 2, after it has been joined to a card metallurgy.

FIG. 7, shows a cross-section of a tin cap solder ball of FIG. 2, after it has been joined to a card 45, having metallurgy 47. The metallurgy 47, could be a line or a pad. Preferably, the metallurgy 47, such as, copper 47, joins with the tin capped solder ball and forms an eutectic 43, of tin and solder. It is preferred that the metallurgy 47, is selected from a group comprising of Au, Co, Cr, Cu, Fe, Ni, TiW, phased Cr and Cu, Au phased Cr and Cu, or alloys thereof. The card 45, could be an organic circuit carrier or a ceramic circuit carrier. If the card 45, is an organic circuit carrier, then it is preferred that it either be a rigid organic circuit carrier or flexible organic circuit carrier. Typical, rigid organic circuit carrier are made from epoxies. While the flexible organic circuit carrier is normally made from polyimides.

The amount of eutectic 43, that is formed will depend upon the amount of low melting point metal 23, that is deposited on top of the solder ball 18. Therefore, it is preferred that the thickness of the low melting point metal cap that is chosen, provides a eutectic volume of between about 5 percent to about 30 percent of the volume of the solder ball 18, and preferably between about 10 percent to about 20 percent of the volume of the solder ball 18.

Conventional methods of making masks, such as, molybdenum masks, holes or openings are formed by photomasking and etching both sides of the mask. This electrochemical etch biases gives rise to a structure of the etched hole where the hole diameter decreases, from either surfaces and reaches a minimum within the hole, giving an appearance of a knife edge. Because the thickness of the metal mask is approximately same as the height of the C4 ball, the knife edge could gouge into the C4 or the solder balls causing mechanical damage to solder ball. As stated earlier, this problem can be solved by photomasking and electro-etching the metal mask from one side only. This will form knife edge 34, as clearly seen in FIG. 5, which is at the top surface of the mask 30, thereby, giving ample clearance between the mask 30 and the solder ball 18.

For the purposes of illustration a chip or wafer have been used as a substrate 10, however the substrate 10, could be selected from a group comprising of organic substrate, multi-layer organic substrate, ceramic substrate, multi-layer ceramic substrate or an integrated circuit chip.

The capping layer of tin 23, could be deposited on the solder ball 18, by a method selected from a group comprising of Radio Frequency evaporation, E-beam evaporation, electroplating, electroless plating or injection method.

As stated earlier that the exposed surface of the reflowed solder ball 18, is capped with at least one low melting point metal 23. It is preferred that between about 10 percent to about 90 percent of the exposed surface of the solder ball is capped, and preferably between about 20 percent to about 80 percent of the exposed surface of the solder ball is capped, and more preferably between about 30 percent to about 50 percent of the exposed surface of the solder ball is capped. Of course the whole solder ball 18, could be capped or enveloped by the low melting point metal 23.

The solder ball 18, having a layer of low melting point metal 23, is typically used as an interconnect to secure the substrate 10, to an electrically conductive assembly 45, such as a next level packaging assembly 45. Typically, the electrically conductive assembly could be selected from a group consisting of an IC chip, capacitor, resistor, a circuit carrier card, a power supply or an amplifying device.

EXAMPLE

The following example is intended to further illustrate the invention and is not intended to limit the scope of the invention in any manner.

Example 1

Semiconductor modules were made using the structure and process of this invention. On a convention solder ball 18, a capping layer of tin 23, was formed. The deposited capping layer of pure tin was between about 0.5 to about 2.0 mil thick, and it was deposited by evaporation. The amount of tin to be deposited on the solder ball 18, was determined by the volume of eutectic solder that is required to completely cover the exposed copper conductors 47, in card or substrate 45. The width and thickness of the copper conductor and the solder mask opening determines the surface area and hence the required eutectic volume. A 20 to 35 cubic mil of eutectic solder 43, volume is preferred for an original 40 to 100 cubic mil of high melt solder ball 18, volume.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of capping a solder ball with at least one layer of low melting point metal, said method comprises the steps of
    (a) forming said solder ball on a substrate,
    (b) placing a mask over said solder ball such that said mask surrounds a portion of said solder ball and such that a portion of said solder ball is exposed,
    (c) depositing at least one layer of a low melting point metal over said solder ball through said mask, such that at least a portion of said solder ball has a capping layer of said low melting point metal, and wherein the melting point of said low melting point metal is lower than the melting point of said solder ball.

2. The method of claim 1, wherein said solder ball is selected from a group consisting of high melting point solder, low melting point solder or C4.

3. The method of claim 1, wherein said substrate is selected from a group consisting of organic substrate, multi-layer organic substrate, ceramic substrate, multi-layer ceramic substrate or an integrated circuit chip.

4. The method of claim 1, wherein said solder ball is on an electrically conductive feature of said substrate.

5. The method of claim 4, wherein material for said electrically conductive feature is selected from a group consisting of Au, Co, Cr, Cu, Fe, Ni, TiW, phased Cr and Cu, and alloys thereof.

6. The method of claim 4, wherein said electrically conductive feature is in electrical contact with at least one internal electrically conductive feature.

7. The method of claim 1, wherein holes for the low melting point metal deposition in said mask are formed by electro-etching from both surfaces of the mask and forming a knife edge along the inner sidewall within said hole in said mask.

8. The method of claim 1, wherein holes for the low melting point metal deposition in said mask are formed by electro-etching from one side of the mask only and forming a slope within said hole in said mask.

9. The method of claim 1, wherein said solder ball comprises lead-tin alloy and wherein said alloy contains between about 2 percent to about 10 percent tin.

10. The method of claim 1, wherein said solder ball comprises lead-tin alloy and wherein said alloy contains between about 98 percent to about 90 percent lead.

11. The method of claim 1, wherein said solder ball is placed on said substrate using a method selected from the group consisting of evaporation, electroplating or solder injection method.

12. The method of claim 1, wherein said at least one layer of low melting point metal is deposited on said solder ball by a method selected from a group consisting of Radio Frequency evaporation, E-beam evaporation, electroplating, electroless plating or injection method.

13. The method of claim 1, wherein said low melting point metal is selected from a group consisting of bismuth, indium, tin or alloys thereof.

14. The method of claim 1, wherein at least a portion of said capped solder ball is secured to an electrically conductive feature on a second substrate.

15. The method of claim 14, wherein material for said electrically conductive feature is selected from a group consisting of Au, Co, Cr, Cu, Fe, Ni, Ta, Ti, TiW, phased Cr and Cu, and alloys thereof.

16. The method of claim 14, wherein said second substrate is selected from a group consisting of organic circuit carrier or ceramic circuit carrier.

17. The method of claim 16, wherein said organic circuit carrier is selected from a group consisting of rigid organic circuit carrier or flexible organic circuit carrier.

18. The method of claim 17, wherein the material for said rigid organic circuit carrier is selected from a group consisting of epoxies.

19. The method of claim 17, wherein the material for said flexible organic circuit carrier is selected from a group consisting of polyimides.

20. The method of claim 1, wherein said low melting point metal, caps between about 10 percent to about 90 percent of the exposed surface of said solder ball, and preferably caps between about 20 percent to about 80 percent of the exposed surface of said solder ball, and more preferably caps between about 30 percent to about 50 percent of the exposed surface of said solder ball.

21. The method of claim 1, wherein said low melting point metal completely envelopes said solder ball.

22. The method of claim 1, wherein said solder ball having a layer of low melting point metal is secured to an electrically conductive assembly.

23. The method of claim 22, wherein said electrically conductive assembly is selected from a group consisting of an IC chip, capacitor, resistor, a circuit carrier card, a power supply or an amplifying device.

24. The method of claim 1, where the thickness of said low melting point metal cap is chosen to provide a eutectic volume of between about 5 percent to about 30 percent of the volume of said solder ball, and preferably between about 10 percent to about 20 percent of the volume of said solder ball.

25. The method of claim 1, wherein the average thickness of said low melting point metal cap is between about 15 to about 50 micro-meters.

26. The method of claim 1, wherein said solder ball is selected from a group consisting of Pb, Bi, In, Sn, Ag, Au, or alloys thereof.

* * * * *